US006278271B1

(12) United States Patent
Schott

(10) Patent No.: US 6,278,271 B1
(45) Date of Patent: Aug. 21, 2001

(54) THREE DIMENSIONAL MAGNETIC FIELD SENSOR

(75) Inventor: Christian Schott, Morges (CH)

(73) Assignee: Sentron AG, Zug (CH)

( * ) Notice: Subject to any disclaimer, the term of this patent is extended or adjusted under 35 U.S.C. 154(b) by 0 days.

(21) Appl. No.: 09/280,200

(22) Filed: Mar. 29, 1999

(30) Foreign Application Priority Data

Mar. 30, 1998 (CH) .................................................. 0760/98

(51) Int. Cl.[7] ........................... G01R 33/07; H01L 43/06; H01L 29/82

(52) U.S. Cl. .......................... 324/251; 324/247; 257/422; 257/426; 257/427; 327/511; 338/324

(58) Field of Search ................................ 324/207.2, 235, 324/247, 251, 117 H; 327/511; 257/421, 422, 426, 427; 338/32 H

(56) References Cited

U.S. PATENT DOCUMENTS

| | | | |
|---|---|---|---|
| 4,987,467 | * 1/1991 | Popovic | 257/421 X |
| 5,057,890 | 10/1991 | Falk et al. | 357/27 |
| 5,548,151 | 8/1996 | Funaki et al. | 257/421 |
| 5,572,058 | * 11/1996 | Biard | 324/251 X |
| 5,646,527 | * 7/1997 | Mani et al. | 324/251 |

OTHER PUBLICATIONS

A 2–D vertical Hall magnetic field sensor using active carrier confinement and micromachining techniques, from M. Paranjape , L. Landsberger and M. Kahrizi, paper 295—PA 12 of the Konferenz Transducers 95—Eurosensors 1X.

Multi–dimensional detection of magnetic fields using CMOS integrated sensors, by M. Paranjape and Lj. Ristic, IEEE Transactions on Magnetics, vol. 27, No. 6, 1991.

A 3–D vertical Hall magnetic–field sensor in CMOS Technology, By M. Paranjape and I. Filanovsky, Sensors and Actuators A, 34 (1992) 9–14.

2–D Integrated magnetic field sensor in CMOS Technology, by Lj. Ristic, M.T. Doan and M. Paranjape, Proc. 32nd Midwest Symp. Circuits and Systems, Champaign–Urbana, IL, USA, Aug. 13–16, 1989.

Micromachined vertical hall magnetic field sensor in standard complementary metal oxide semiconductor technology, by M. Paranjape and Lj. Ristic, Appl. Phys. Lett. 60 (25), Jun. 22, 1992.

3–D magnetic filed sensor realized as a lateral magnetotransistor in CMOS Technology, by Lj. Ristic, M.T. Doan and M. Paranjape, Sensors and Actuators, A21–A23 (1990) 770–775.

Monolithic silicon magnetic compass, by K. Maenaka, M. Tsukahara and T. Nakamura, Sensors and Actuators A21–A23 (1990) 747–750.

* cited by examiner

*Primary Examiner*—Gerard R. Strecker
(74) *Attorney, Agent, or Firm*—McCormick, Paulding & Huber LLP

(57) ABSTRACT

A magnetic field sensor for measurement of the three components ($B_x$, $B_y$, $B_z$) of a magnetic field comprises a Hall-effect element (1) and an electronic circuit (22). The Hall-effect element (1) comprises an active area (18) of a first conductivity type which is contacted with voltage and current contacts (2–5 or 6–9). Four voltage contacts (2–5) are present which are connected to inputs of the electronic circuit (22). By means of summation or differential formation of the electrical potentials ($V_2$, $V_3$, $V_4$, $V_5$) present at the voltage contacts (2–5), the electronic circuit (22) derives three signals ($V_x$, $V_y$, $V_z$) which are proportional to the three components ($B_x$, $B_y$, $B_z$) of the magnetic field.

6 Claims, 4 Drawing Sheets

THREE DIMENSIONAL MAGNETIC FIELD SENSOR

BACKGROUND OF THE INVENTION

Figure 1:
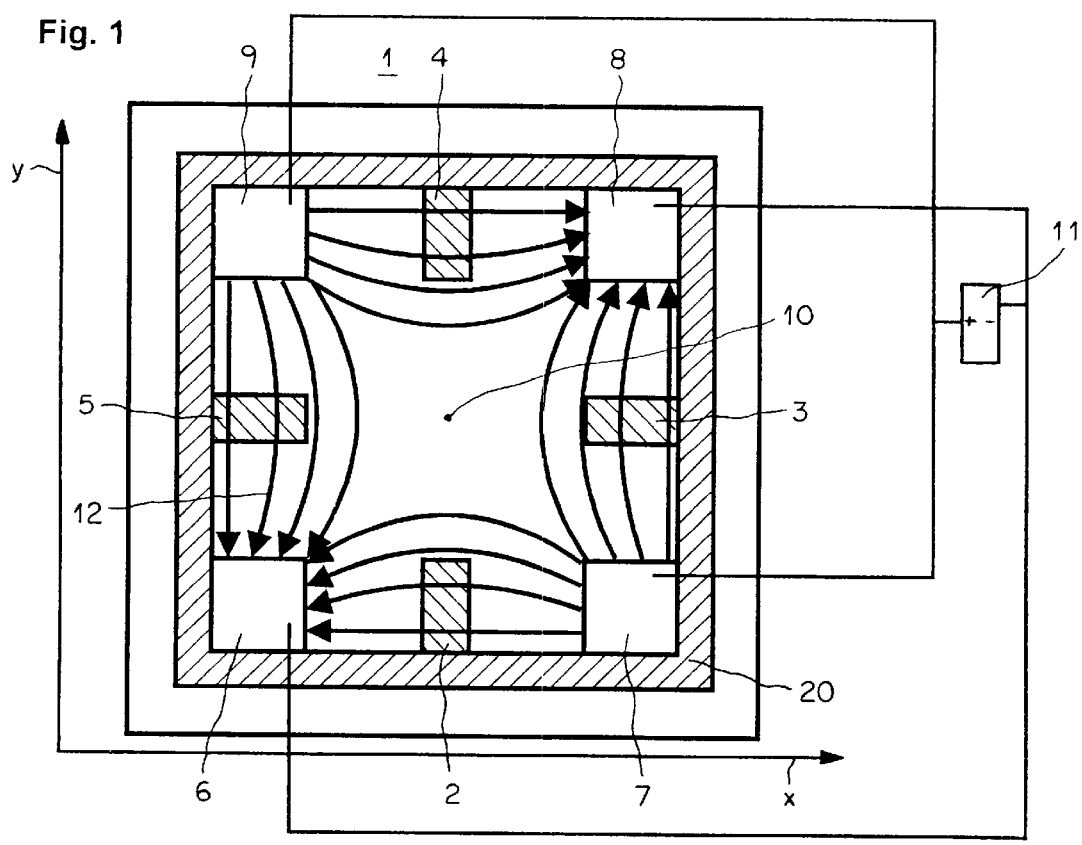

The invention is related to a magnetic field sensor comprising a Hall-effect element.

Such magnetic field sensors are suitable, for example, for use in magnetometers which are designed for the measurement of two or all three components of a magnetic field.

The use of Hall-effect elements as magnetic field sensors has been normal for a long time. Hall-effect elements which are manufactured in conventional IC technology have all the advantages of this technology in particular the high reproducibility of their magnetic and electrical characteristics at comparatively low cost. For the measurement of the magnetic field component which is vertical to the chip surface, so-called horizontal Hall-effect elements are used while so-called vertical Hall-effect elements are used for measurement of the magnetic field component which is parallel to the chip surface. Vertical Hall-effect elements are electrically short-circuited to the substrate. Therefore, it is not easily possible to use two vertical Hall-effect elements which are turned by 90° and integrated into the same chip for simultaneous measurement of the two components $B_z$ and $B_y$ of the magnetic field B which are parallel to the chip surface. Several magnetic field sensors are known from scientific literature which are based on the structure of the vertical Hall-effect element and which enable the simultaneous measurement of the two components $B_x$ and $B_y$. These Hall-effect elements have five current contacts and four Hall contacts. From the article "a A 2-D vertical Hall magnetic field sensor using active carrier confinement and micromachining techniques" from M. Paranjape, L. Landsberger and M. Kahrizi, paper 295—PA 12 of the Konferenz Transducers 95—Eurosensors IX it is known to reduce the sensitivity of the HallI-effect element to feedover in that the zones relevant for the Hall-effect are formed as three-dimensional surface structures by means of micromechanical processes. In addition, it is known from the articles "Multi-dimensional detection of magnetic fields using, CMOS integrated sensors" by M. Paranjape and Lj. Ristic, IEEE Transactions on Magnetics, Vol. 27, No. 6, 1991 and "A 3-D vertical Hall magnetic-field sensor in CMOS technology" by M. Paranjape and I. Filanovsky, Sensors and Actuators A, 34 (1992) that a magnetic field sensor can be constructed which also enables the measurement of the component $B_z$ of the magnetic field B which is vertical to the chip surface by separating each of the four Hall contacts into two Hall contacts so that a total of eight Hall contacts are present. The sensitivity of these magnetic field sensors with regard to the component $B_z$ is however considerably lower than the sensitivity with regard to the $B_x$ or $B_y$ component.

The object of the invention is to propose a magnetic field sensor which can be easily manufactured and which is suitable for measuring a t least two, preferably all three components of a magnetic field with high local resolution.

BRIEF DESCRIPTION OF THE INVENTION

A magnetic field sensor for measurement of the three components $B_x$, $B_y$, $B_z$ of a magnetic field B comprises a Hall-effect element and an electronic circuit. The Hall-effect element comprises an active area which is contacted with four voltage contacts and current contacts. The Hall voltages present at the four voltage contacts are fed to inputs of the electronic circuit. By means of summation and/or differential formation of the four Hall voltages the electronic circuit derives three signals $V_x$, $V_y$, $V_z$ which are proportional to the three components $B_x$, $B_y$, $B_z$ of the magnetic field B.

Embodiments of the invention are explained in more detail hereinafter with reference to the drawing.

BRIEF DESCRIPTION OF THE DRAWING FIGURES

Figure 2:
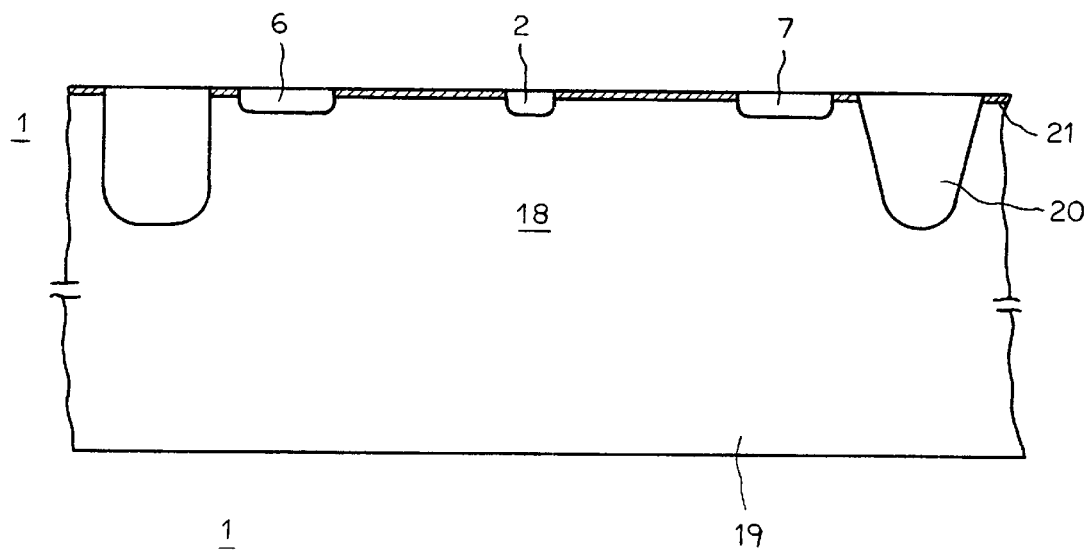
Figure 3:
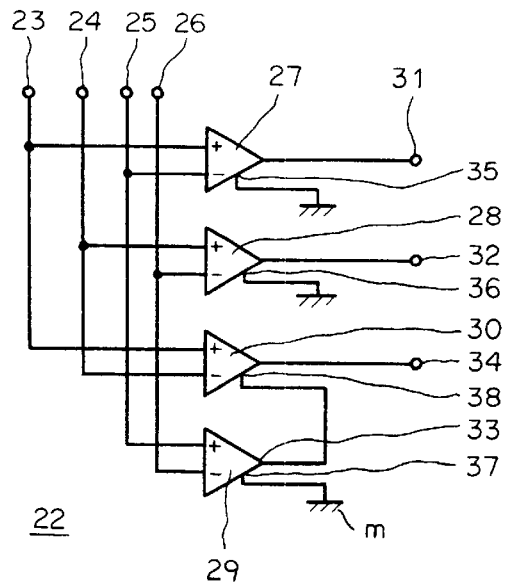
Figure 4:
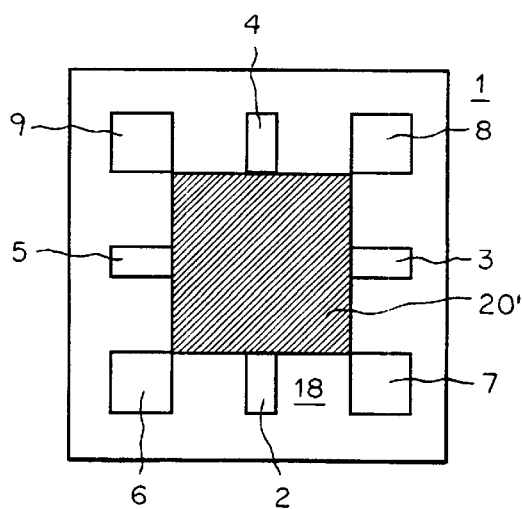
Figure 5:
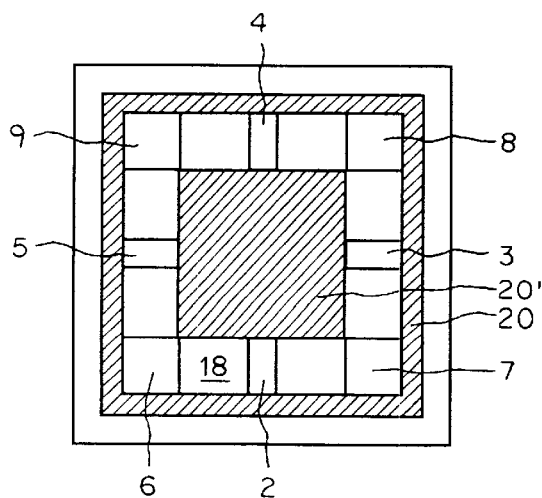
Figure 6:
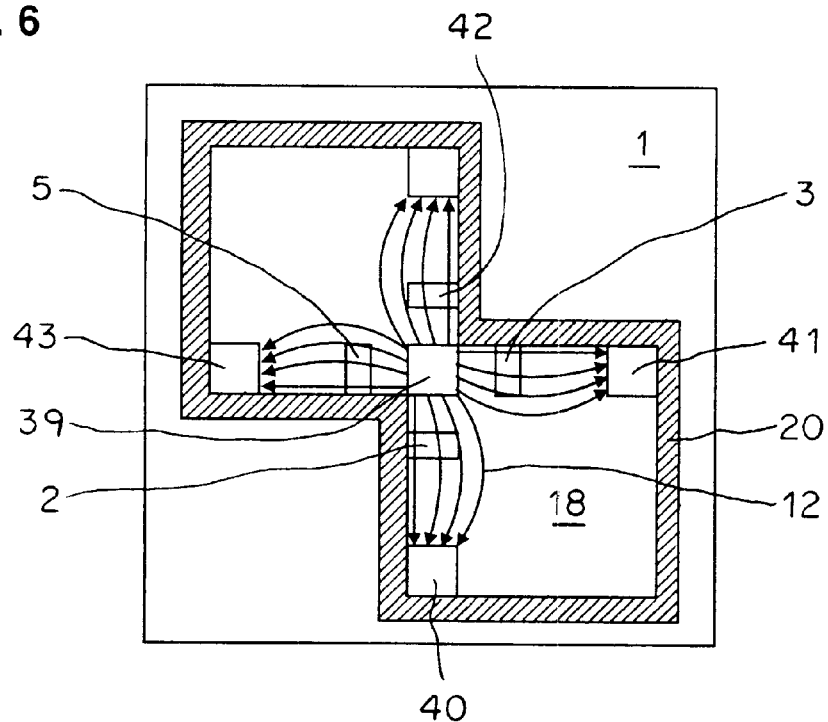
Figure 7A:
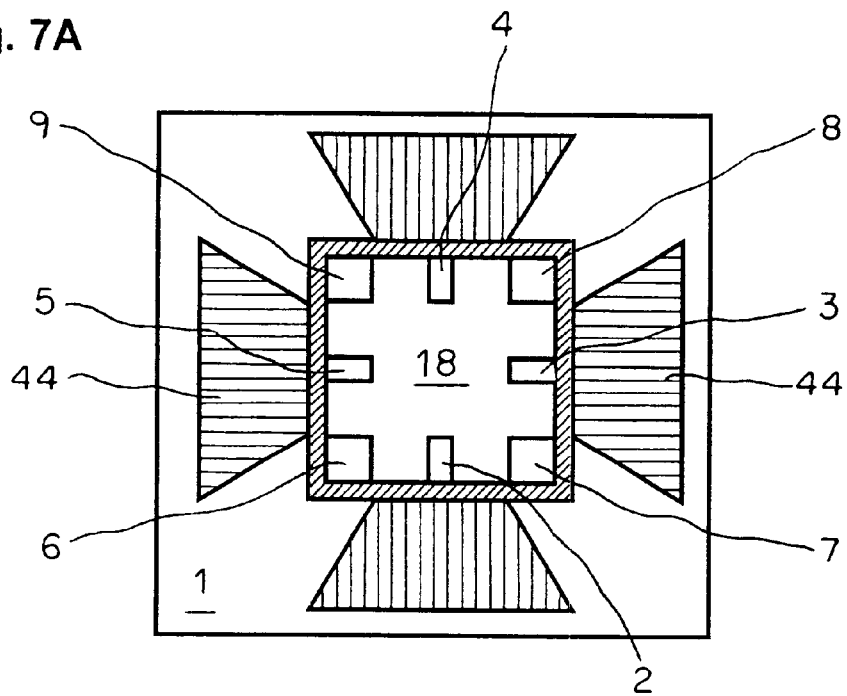
Figure 8:
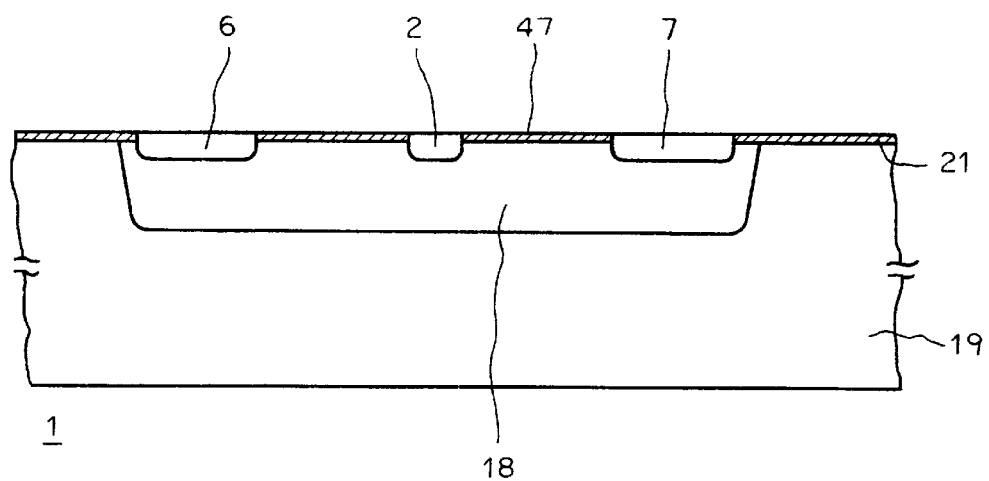

It is shown, in:

FIG. 1 the plan view of a Hall-effect element,

FIG. 2 a vertical section through the Hall-effect element which is electrically connected to the substrate, FIG. 3 a circuit for evaluating the potentials at the voltage contacts of the Hall-effect element, FIGS. 4–6 further Hall-effect elements, FIGS. 7a, b Hall-effect elements, which additionally have magnetic field concentrators, and FIG. 8 a vertical section through a Hall-effect element which is completely insulated from the substrate.

DETAILED DESCRIPTION OF THE INVENTION

FIG. 1 shows the plan view of a Hall-effect element 1 which serves as a magnetic field sensor for determining the three components $B_x$, $B_y$ and $B_z$ of a magnetic field B. The components $B_x$, $B_y$ and $B_z$ are defined in relation to a cartesian coordinate system with the axes x, y and z. The Hall-effect element 1 has four voltage contacts 2–5 and four current contacts 6–9. The Hall-effect element 1 is preferably formed as a square, whereby the four current contacts 6–9 are arranged at the corner points of the square and symmetrically with regard to the centre point 10 of the square. The voltage contacts 2–5 are also arranged symmetrically with regard to the centre point 10 and are preferably, but not imperatively, located in the geometrical centre between two of the current contacts 6–9. The current contacts 6 and 8 are connected to the plus pole of an external current source 11, the current contacts 7 and 9 are connected to the minus pole of the current source 11. In operation therefore, a current I flows through the Hall-effect element 1 between the current contacts 6–9. The local current density J of the current I is presented in FIG. 1 by means of arrows 12.

The sides of the square are orientated parallel to the x and y directions of the coordinate system, while the z direction is orientated vertical to the plane of the drawing. The electrical potential occurring at the voltage contacts 2–5 is dependent on the one hand on the strength of the current 1 and, on the other hand, on the components $B_x$, $B_y$ and $B_z$ of the magnetic field B. The potential at voltage contact 2 is dependent on the components+$B_x$ and+$B_z$ of the magnetic field B, the potential at voltage contact 4 is dependent on the components−B, and+B, of the magnetic field B. This result comes from the fact that the vector product from the local current density field J at voltage contact 2 and the component $B_x$ of the magnetic field B, which is responsible for the so-called Hall voltage, points in the opposite direction to the vector product from the local current density field J at voltage contact 4 and the component $B_x$ of the magnetic field B. The vector product from the local current density field J at voltage contact 2 and the component $B_z$ of the magnetic field B however points in the same direction as the vector product from the local current density field J at voltage contact 4 and the component $B_z$ of the magnetic field B. By adding the potentials occurring at the voltage contacts 2 and 4 a signal results which is only dependent on the component $B_z$ of the magnetic field B, while subtraction of these potentials results in a signal which is only dependent on the component $B_x$ of the magnetic field B.

If the corresponding Hall voltages of the components $B_x$, $B_y$ and $B_z$ of the magnetic field B are designated $V_x=V(B_x)$, $V_y=V(B_y)$ and $V_z=V(B_z)$, then the following relationships are valid for the potentials $V_2$ to $V_5$ at the voltage contacts 2 to 5:

$$V_2=V_x+V_z \quad (1)$$

$$V_3=V_y-V_z \quad (2)$$

$$V_4=-V_x+V_z \quad (3)$$

$$V_5=-V_y-V_z \quad (4)$$

By means of conversion, this results in:

$$V_x=\tfrac{1}{2}(V_2-V_4) \quad (5)$$

$$V_y=\tfrac{1}{2}(V_3-V_5) \quad (6)$$

$$V_z=\tfrac{1}{4}(V_2+V_4-V_3-V_5) \quad (7)$$

The variable $V_z$ can also be determined according to the equations $$V_z=\tfrac{1}{2}(V_2+V_4) \text{ or} \quad (8)$$

$$V_z=-\tfrac{1}{2}(V_3+V_5) \quad (9)$$

The equation (7) therefore contains an average of the Hall voltages $V_z$ obtained with the equations (8) and (9).

FIG. 2 shows the Hall-effect element 1 in a sectional plane which runs parallel to the x axis and through the contacts 6, 2 and 7. The Hall-effect element 1 is preferably manufactured as a chip in the semiconductor technology. The Hall-effect element 1 comprises an active area 18 sensitive for the measurement of the components $B_x$, $B_y$ and $B_z$ which consists of a relatively low doped semiconductor material of a first conductivity type. The active area 18 is part of the substrate 19 of the chip. The current contacts 6–9 and voltage contacts 2–5 are high doped areas of the first conductivity type which are connected in the conventional way via printed conductors to connection points, so-called pads, for external bonding. The active area 18 consists preferably of n-conducting silicon because Hall-effect elements with extreme long-term stability can be manufactured with the silicon technology. Optionally, there is a thin layer 21 of p-doped silicon between the active area 18 and the surface.

The Hall-effect element 1 can be manufactured as a Hall-effect element with reduced linear dimensions compared to prior art as there are only two current contacts and one voltage contact each along the x direction as well as along the y direction. With conventional 2-D (2-dimensional) or 3-D Hall-effect elements, at least five contacts are arranged along the x or y direction. As, in addition, no areas of a second conductivity type, as for example the semiconductor ring 20 (FIG. 2) described below, are necessary, there is also no problem of alignment between the high doped contacts of the first conductivity type and the areas of the second conductivity type so that the offset of the Hall voltage, ie, the Hall voltage at the absence of the magnetic field B, is smaller than with conventional Hall-effect elements.

Such a Hall-effect element 1 is suitable as a 2-D or 3-D magnetic field sensor for the measurement of the components $B_x$, $B_y$ parallel to its surface or of all three components $B_x$, $B_y$ and $B_z$ of the magnetic field B. The sensitivity with regard to the component $B_z$, however, increases significantly when the active area 18 is bordered by a semiconductor ring 20 (FIG. 2) of a second conductivity type which has a depth of typically 10–30 μm. An insulating PN junction forms between the active area 18 and the semiconductor ring 20 which limits the effective active area 18. The measured sensitivities of such a Hall-effect element 1 amount to around $V_x \cong V_y = 50$ mV/mAT and $V_z 10$ mV/mAT. The cross-correlation of the sensitivities which lies in the per mill range is very low compared with values of around 10% in accordance with prior art.

FIG. 3 now shows an electronic circuit 22 which is suitable for determining the variables $2V_x$, $2V_y$ and $^4V_z$. The circuit 22 has four inputs 23–26 which are connected to inputs from four instrumentation amplifiers 27–30. Suitable instrumentation amplifiers are available commercially for example from the companies Burr Brown or Analog Devices under the designation "Instrumentation Amplifier". Each of the instrumentation amplifiers 27–30 has an inverting and a non-inverting input as well as a reference input. Hall voltage $V_2$ is supplied to input 23 of the circuit 22, Hall voltage $V_3$ to input 24, Hall voltage $V_4$ to input 25 and Hall voltage $V_5$ to input 26. Each of the instrumentation amplifiers 27–30 is switched internally so that its output carries a voltage $U_A$ which equals the sum of the voltages $U_R$ and U+ present at the reference input and the non-inverting input, minus the voltage U_ applied at the inverting input: $U_A=U_R+U_+-U_-$. The reference inputs 35, 36, 37 of the first, second and third instrumentation amplifiers 27, or 28, or 29, are connected to ground m serving as a reference potential. The reference input 38 of the fourth instrumentation amplifier 30 is connected to the output 33 of the third instrumentation amplifier 29. The non-inverting input of the first instrumentation amplifier 27 is connected to the input 23 SO that the Hall voltage $V_2$ is present at it. The inverting input of the first instrumentation amplifier 27 is connected to the input 25 so that the Hall voltage $V_4$ is present at it. Its output 31 therefore carries the voltage $U_{A1}=V_2-V_4=2V_x$. As can be further seen from the wiring shown in the Figure, the output 32 of the second instrumentation amplifier 28 carries the voltage $U_{A2}=V_3-V_5=2V_y$, the output 33 of the third instrumentation amplifier 29 the voltage $U_{A3}=V_4-V_5$ and the output 34 of the fourth instrumentation amplifier 30 the voltage $U_{A4}=U_{A3}+V_2-V_3=V_2+V_4-V_3-V_5=4V_z$.

The total sensitivities at the three outputs 31–33 of the electronic circuit 22 of the magnetic field sensor which comprises the Hall-effect element 1 and the electronic circuit 22 therefore amount to around $V(B_x) \cong V(B_y) \cong 100$ mV/mAT and $V(B_z) \cong 40$ mV/mAT.

The voltage $V_z$ can also be represented as the sum of the differences of pairs of adjacent voltage contacts 2–5: $8V_z=(V_2-V_3)+(V_4-V_5)+(V_2-V_5)+(V_4-V_3)$. The voltage $V_z$ can also be determined accor relationship, whereby the circuit 22 shown in FIG. 3 has then to be extended with two further instrumentation amplifiers which add the differences $V_2-V_5$ and $V_4-V_3$ to the voltage at the output 34 of the fourth instrumentation amplifier 30. A circuit extended in this manner has the advantage that the voltage $V_z$ presents a value for the component $B_z$ of the magnetic field B which is optimally averaged over the volume of the magnetic field sensor defined through the active area.

Further Hall-effect elements are now presented below which mainly differ from the Hall-effect elements described up to now in the geometry but hardly differ in their electrical or magnetic characteristics.

FIG. 4 shows a Hall-effect element 1 suitable for a 3-D magnetic field sensor for which the active area 18 and the current and voltage contacts 6–9 and 2–5 are not bordered by the ring 20 shown in FIGS. 1 and 2 but for which the active area 18 and the current and voltage contacts 6–9 and 2–5 are arranged outside a square area 20'. The area 20' consists, as for the ring 20, of semiconductor material whose conductivity type is inverse to that of the active area 18.

FIG. 5 shows a Hall-effect element 1 with the square area 20' and the ring 20 with which the active area 18 and the current and voltage contacts 6–9 and 2–5 are arranged in a channel which is limited by areas of the second conductivity type.

FIG. 6 shows a Hall-effect element 1 with a cross-shaped arrangement of the current and voltage contacts whereby the active area 18 is surrounded by the ring 20 as presented. This Hall-effect element 1 has one single central current contact 39 which is connected to one pole of the current source and four current contacts 40–43 which are connected to the other pole of the current source. The four current contacts 40–43 and the voltage contacts 2–5 are arranged symmetrically in relation to the central current contact 39. It is not necessary to arrange the voltage contacts 2–5 geometrically in the centre between the central current contact 39 and the corresponding outer current contacts 40–43.

Of course other geometries of the Hall-effect element 1 can be realized. From the US American patent U.S. Pat. No. 5,057,890 it is known that Hall-effect elements are invariant under conformal mapping and therefore can have any geometrical shapes. Likewise, the position of the voltage contacts can be displaced in comparison with the position of the current contacts so long as the displacements do not lead to alterations to the Hall voltages $V_x$, $V_y$ and $V_z$.

Figure 7B:
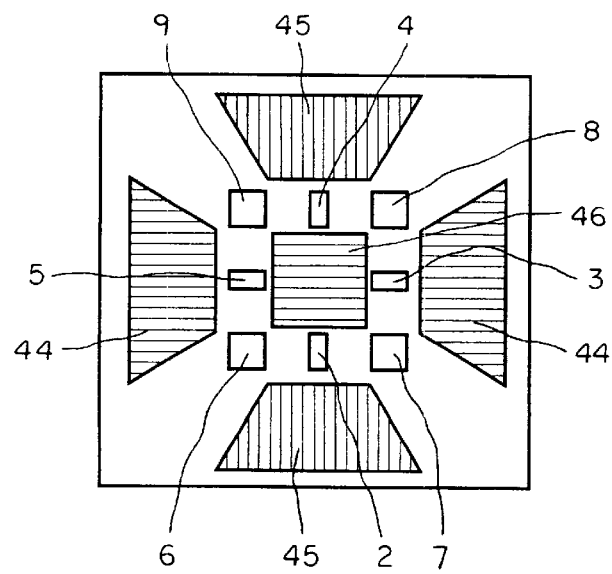

The semiconductor ring 20 (FIG. 2) can either float freely or can be connected to the minus pole of the current source 11 (FIG. 1) or it can be set to a potential predefined in relation to the poles of the current source 11 whereby it must be noted that the PN junction must always be poled in the reverse direction. A Hall-effect element 1 which only has the current and voltage contacts 6–9 and 2–5 contacting the active area 18 and possibly the thin layer 21 which therefore is neither laterally limited by an area of the second conductivity type nor limits such, is well suited, in connection with magnetic field concentrators, as a 2-D magnetic field sensor for measurement of the components $B_x$ and $B_y$ of the magnetic field B directed parallel to its surface. FIGS. 7a and 7b show a plan view of such magnetic field sensors. Preferably, trapezoidal formed magnetic field concentrators 44, 45 are arranged on the surface of the Hall-effect element 1. The magnetic field concentrators 44 amplify the component $B_x$, the magnetic field concentrators 45 amplify the component $B_y$ of the magnetic field B in the area of the corresponding Hall contacts and therefore increase the sensitivity of the magnetic field sensor for the components $B_x$ and $B_y$. For the embodiment according to FIG. 7b a magnetic field concentrator 46 is also located in the centre of the Hall-effect element 1. The magnetic field concentrators 44, 45, 46 consist of ferromagnetic material, eg, mumetal or permalloy. The area 20 of the second conductivity type limiting the active area 18 presented in FIG. 7a can be present or omitted.

The magnetic field sensors disclosed altogether demonstrate the following advantages:
a) Measurement of the three components $B_x$, $B_y$ and $B_z$ of the magnetic field B takes place at a common volume or point (common active area 18).
b) Comparable sensitivities of all three components $B_x$, $B_y$ and $B_z$ of the magnetic field B at very low crosscorrelation.
c) The voltages $V_x$, $V_y$ and $V_z$ distinguish themselves by means of high linearity in relation to the magnetic field B.
d) The number of necessary electrical connections is limited to 6.
e) The active area 18 comprises a small area which typically amounts to only 100 $\mu$m * 100 $\mu$m up to 300 $\mu$m * 300 $\mu$m.
f) High long-term stability as the magnetic field sensors can be manufactured in the proven silicon technology.

FIG. 8 shows a section of the Hall-effect element 1 in an embodiment with which the active area 18 is electrically insulated from the substrate 19. The substrate 19 consists preferably of p-conducting material which completely surrounds the n-conducting material of the active area 18 on all sides, possibly with the exception of the surface 47.

What is claimed is:

1. Magnetic field sensor for measurement of the three components of a magnetic field comprising a Hall-effect element and an electronic circuit, whereby the Hall-effect element has an active area of a first conductivity type which is contacted with voltage and current contacts whereby at least four current contacts for current feed and four voltage contacts are present, whereby the voltage contacts are connected to the electronic circuit which derives three signals, each by means of one of: summation, differential, and both summation and differential formation of the electrical potentials present at the voltage contacts which are proportional to the three components of the magnetic field.

2. Magnetic field sensor according to claim 1 whereby the active area is neither laterally limited by an area of a second conductivity type nor itself laterally limits an area of a second conductivity type.

3. Magnetic field sensor according to claim 1 whereby the active area is laterally limited by an area of a second conductivity type and/or laterally limits an area of a second conductivity type.

4. Magnetic field sensor according to claim 1, whereby magnetic field concentrators are present which amplify the two components of the magnetic field directed parallel to the surface of the Hall-effect element in the area of the corresponding voltage contacts.

5. Magnetic field sensor according to claim 1, whereby the electronic circuit forms at least one signal by means of instrumentation amplifiers.

6. Magnetic field sensor according to claim 1, whereby a maximum of three current and/or voltage contacts are arranged along any direction.

* * * * *